(12) United States Patent
Chang et al.

(10) Patent No.: US 7,944,223 B2
(45) Date of Patent: May 17, 2011

(54) BURN-IN TESTING SYSTEM

(75) Inventors: Venson Chang, Shanghai (CN); Kary Chien, Shanghai (CN); Shunwang Chiang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/882,051

(22) Filed: Sep. 14, 2010

(65) Prior Publication Data
US 2011/0084718 A1    Apr. 14, 2011

(30) Foreign Application Priority Data

Oct. 9, 2009   (CN) .......................... 2009 1 0196931

(51) Int. Cl.
*G01R 31/10* (2006.01)
(52) U.S. Cl. ......... 324/750.05; 324/754.08; 324/756.01; 324/756.02
(58) Field of Classification Search ............. 324/750.05, 324/754.08, 760
See application file for complete search history.

(56) References Cited

U.S. PATENT DOCUMENTS

| | | | | |
|---|---|---|---|---|
| 4,801,871 | A | * | 1/1989 | Tada et al. ..................... 324/73.1 |
| 5,387,861 | A | * | 2/1995 | Neiderhofer ............. 324/750.05 |
| 6,774,657 | B2 | * | 8/2004 | Hashimoto et al. ...... 324/756.02 |
| 7,135,878 | B2 | * | 11/2006 | Zhang ..................... 324/750.05 |

FOREIGN PATENT DOCUMENTS

| | | | |
|---|---|---|---|
| CN | 1979193 A | | 6/2007 |
| JP | 06-058987 | * | 4/1994 |

* cited by examiner

*Primary Examiner* — Ha Tran T Nguyen
*Assistant Examiner* — Richard Isla Rodas
(74) *Attorney, Agent, or Firm* — Squire, Sanders & Dempsey (US) LLP

(57) ABSTRACT

The present invention discloses a burn-in testing system including a burn-in board and a burn-in testing apparatus, the burn-in board including: a first interface component, adapted to connect with the burn-in testing apparatus for signal input and/or output between the burn-in board and the burn-in testing apparatus; and a second interface component, adapted to connect with a device under test for signal input and/or output between the burn-in board and the device, wherein the burn-in testing system further includes a pin matching unit flexibly connected with the burn-in board and adapted to adjust signal connection relationship between the first interface component and the second interface component according to a pin description of the device. By using the invention, burn-in tests of various devices having the same number of pins and different pin descriptions can be performed using the same burn-in board, which is compatible with existing burn-in boards, thereby improving production efficiency and reducing production costs.

7 Claims, 3 Drawing Sheets

BURN-IN TESTING SYSTEM

This application claims the benefit of Chinese patent application No. 200910196931.2, titled "Burn-in Testing System" and filed with the Chinese Patent Office on Oct. 9, 2009, which is herein incorporated by reference in its entirety.

FIELD OF THE INVENTION

The present invention relates to the field of burn-in techniques and in particular to a burn-in testing system.

BACKGROUND OF THE INVENTION

To ensure device reliability, normally burn-in tests are conducted in burn-in testing systems once the devices are manufactured. A burn-in test is to apply an elevated voltage higher than the operating voltage to the control gate of a transistor of memory for a long period of time at an elevated temperature, usually 85° C. or above, making every element of the device subject to an overload, thereby exposing defects in the device in an early stage and detecting those devices with defects.

A common burn-in testing system includes a burn-in testing apparatus and a Burn-In Board (BIB). For an improved yield, normally multiple devices under test are mounted on a large printed circuit board, i.e., the burn-in board. The devices under test on the burn-in board are connected in parallel, and their burn-in tests are performed at the same time. For more information on the burn-in testing apparatus and the structure of the burn-in board, please refer to Chinese Patent Application No. 200610163541.1 titled "Burn-in testing apparatus and burn-in testing board".

In the testing process, first a device under test is connected with a burn-in board, and the burn-in board is put into an environmental testing oven of a burn-in testing apparatus and is connected with a drive unit therein, then a testing environment desired for the test is achieved by adjusting conditions such as temperature according to a function to be tested for the device, and functional test is performed by the drive unit on the device through the burn-in board to detect the defect.

At present, before carrying out the test, a burn-in testing apparatus manufacturer normally makes a burn-in board corresponding to a pin description of the device under test. When a new semiconductor device is to be tested, or when the pin description of the device is changed, a new burn-in board corresponding to the new pin description has to be made. Therefore, conventional burn-in testing systems have a low utilization of burn-in boards. Normally it takes weeks and thousands of dollars to make a burn-in board, and the low utilization may greatly increase production costs, prolong production cycle time, and hindering efficiency improving.

In view of the foregoing problem, a burn-in board applicable to various types of semiconductor devices is desired in burn-in technologies for semiconductor devices.

SUMMARY OF THE INVENTION

A technical problem solved by the invention is to provide a burn-in testing system so that various types of semiconductor devices with different pin descriptions can be tested using the same burn-in board.

In order to solve the technical problem above, the invention provides a burn-in testing system including a burn-in board and a burn-in testing apparatus, the burn-in board including: a first interface component, adapted to connect with the burn-in testing apparatus for signal input and/or output between the burn-in board and the burn-in testing apparatus; and a second interface component, adapted to connect with a device under test for signal input and/or output between the burn-in board and the device, wherein the burn-in testing system further includes a pin matching unit, which is flexibly connected with the burn-in board and is adapted to adjust signal connection relationship between the first interface component and the second interface component according to a pin description of the device.

Optionally, the burn-in board further includes a plurality of pin interfaces corresponding to the pin matching unit.

Optionally, the pin interfaces includes: a first interface section connected with the first interface component; and a second interface section connected with the second interface component.

Optionally, the pin matching unit includes a plurality of pins, which are plugged in the pin interfaces for connecting the first interface section and the second interface section of the pin interfaces.

Optionally, the pin matching unit is mounted on an opposite side of the burn-in board with respect to the second interface component.

Optionally, the pin matching unit includes: a matching chip, adapted to establish signal matching between the second interface component and the first interface component; and a package circuit and pins, the package circuit being adapted to package the matching chip and to enable signal transmission between the matching chip and external circuits via the pins.

Optionally, the pin matching unit further includes: an auxiliary matching unit, adapted to perform auxiliary adjustment of a matching result of the matching chip.

Optionally, the second interface component is fixedly connected with the burn-in board.

The invention have the following advantages over the prior art:

The pin matching unit enables dynamic re-matching between the burn-in testing apparatus and pins of the device for transmitted signals according to the pin description of the device, so that burn-in tests of various devices having the same number of pins and different pin descriptions can be performed using the same burn-in board, thereby improving utilization of the existing burn-in board, improving production efficiency and reducing production costs.

BRIEF DESCRIPTION OF THE DRAWINGS

The foregoing and other objects, features and advantages of the invention will be more apparent from the detailed description of the preferred embodiments of the invention as shown in the accompanying drawings, in which identical reference numerals denote the same component. The drawings are not to scale, but focus on the major idea of the invention.

DETAILED DESCRIPTION OF THE INVENTION

Numerous design details are described hereinafter for a better understanding of the invention. However, the invention can be implemented in other ways different from these described herein, and those skilled in the art can make modifications or alternations without departing from the scope of the invention. Therefore, the invention shall not be limited to the embodiments described below.

In addition, the invention is detailed with reference to the drawings. While describing the embodiments of the invention, a sectional view of the structure of the device may be partially enlarged but not necessarily to scale. The drawings are only for illustrative reasons, and shall not limit the scope of the invention. Furthermore, three dimensions including length, width and depth shall be included in practice.

In a conventional burn-in testing system, when a device is manufactured and to be tested, each of the pins of the device is studied first, then a burn-in board is made according to a pin description of the device, and used in a burn-in test on the device. That is, in the conventional burn-in testing system, a burn-in board can only be used in testing the device having the particular pin description, or a device having the same number of pins and the same pin description as the particular device, and therefore being limited by the pin description of the device.

Through repeated experiments and studies, the inventors customize a pin matching unit according to a device under test, the pin matching unit being detachable and flexibly connected with a burn-in board, therefore in practice of the burn-in testing system, various devices under test having different pin descriptions can be tested by means of different pin matching units, thereby improving utilization of the burn-in board. Compared with the burn-in board, the detachable pin matching unit has a lower production cost and a shorter cycle time; therefore, using the embodiments of the invention production efficiency can be significantly improved and production costs can be greatly reduced.

Embodiments of the invention are described hereinafter with reference to the drawings.

Figure 1:
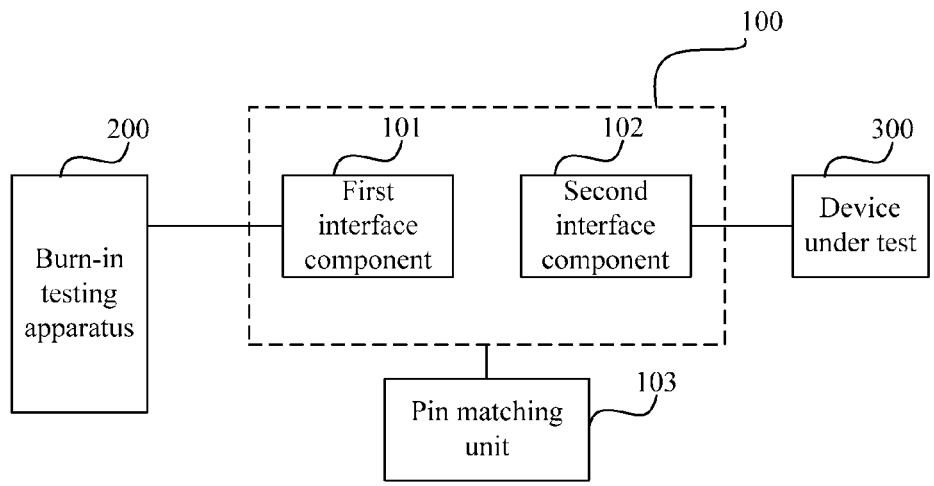
FIG. 1 is a structural diagram of an embodiment of a burn-in testing system according to the invention.

As shown in FIG. 1, an embodiment of the invention provides a burn-in testing system including a burn-in board 100, a burn-in testing apparatus 200 and a device under test 300. The burn-in board 100 includes: a first interface component 101, adapted to connect with the burn-in testing apparatus 200 for signal input and/or output between the burn-in board and the burn-in testing apparatus 200; and a second interface component 102, adapted to connect with the device under test 300 for signal input and/or output between the burn-in board and the device under test 300. The burn-in testing system further includes a pin matching unit 103, which is flexibly connected with the burn-in board 100 and is adapted to adjust signal connection relationship between the first interface component 101 and the second interface component 102 according to a pin description of the device under test 300.

Figure 2:
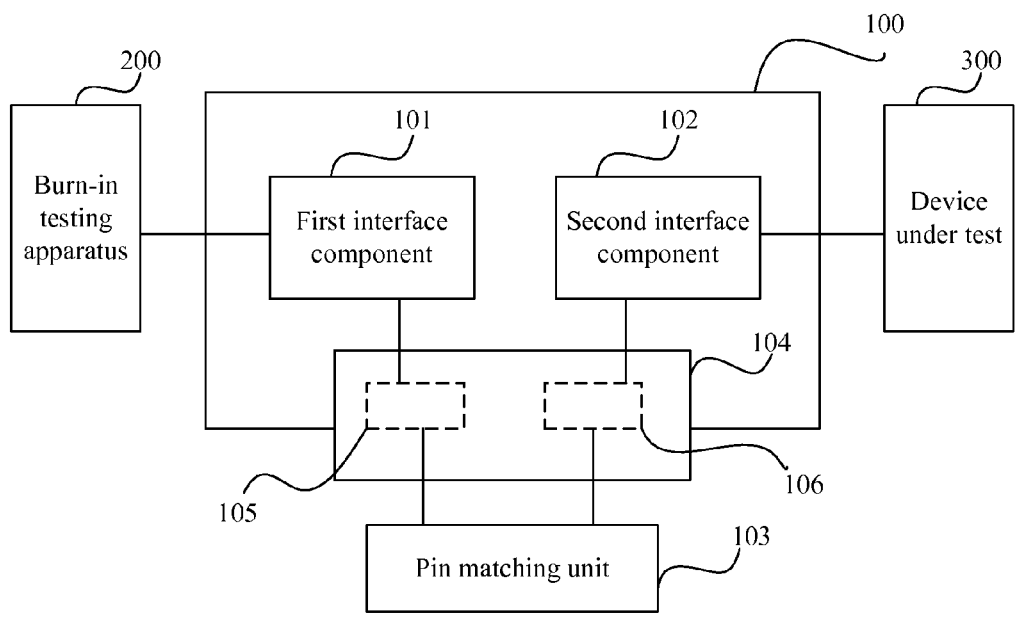
FIG. 2 is a structural diagram of an embodiment of a burn-in testing system according to the invention.

In an embodiment shown in FIG. 2, the pin matching unit 103 may have multiple pins, and pin interfaces 104 corresponding to the pins of the pin matching unit 103 may be arranged on the burn-in board 100. The first interface component 101 includes multiple leads connected with a first interface section 105 of the pin interfaces 104 via a circuit in the burn-in board 100 respectively, thereby a signal path between the pin matching unit 103 and the burn-in testing apparatus 200 is established through the first interface component 101.

The second interface component 102 includes multiple pin interfaces electrically connected with the pin interfaces 104, particularly, with a second interface section 106 of the pin interfaces 104. Since the second interface component 102 is connected with the device under test 300, a signal path between the pin matching unit 103 and the device under test 300 can be established through the second interface component 102.

Generally, the second interface component 102 is fixedly connected, e.g., soldered, on the burn-in board 100; and the pin matching unit 103 is flexibly and detachably connected with the burn-in board 100. Prior to a burn-in test, a prepared pin matching unit corresponding to the current device is mounted on the burn-in board. For example, the pin matching unit may be connected with the burn-in board by plugging, so that the current pin matching unit can be conveniently removed when the burn-in test is done. When a new device is to be tested, a new pin matching unit corresponding to the new device is made, the pin matching unit used in the previous test is removed, and the new pin matching unit is mounted on the burn-in board for burn-in testing of the new device.

In an embodiment, the pin matching unit may be mounted on an opposite side of the burn-in board with respect to the second interface component, so that the pin matching unit and the second interface component can be arranged separately, to avoid potential mechanical damages to the pin matching unit as well as negative influence to the pin matching unit from the heat dissipating from the device under test.

Prior to a burn-in test, the pin matching unit may be made according to a pin description of the device under test, so that the pin matching unit can be adapted to the device. Particularly, the pin description of the device can be loaded to the pin matching unit 103 by manually wire jumping; or, the pin description of the device can be loaded to the pin matching unit 103 automatically with software.

In an embodiment, the pin matching unit 103 may be a circuit board with a matching chip. In manufacturing, the matching chip (IC) may be made corresponding to the pin description of the device under test, and then a corresponding circuit board may further be made to form the pin matching unit 103.

In particular, normally it only takes days to make the pin matching unit 103, and at a low cost. For example, for a burn-in test on an SRAM in 0.13 μm, which is large in size and may complicate the manufacturing process of the pin matching unit, manufacturing and preliminary testing of such a pin matching unit only take two weeks and cost 7 or 8 dollars. As compared with the manufacturing of a burn-in board which takes weeks and costs thousands of dollars, making and changing pin matching units enable the burn-in test of various types of devices, and production efficiency can be significantly improved and production cost can be reduced.

In an embodiment of the invention implementing the burn-in board, prior to a burn-in test, first a pin matching unit is made according to a pin description of a device under test and is mounted on the burn-in board at a corresponding location; next the device is connected with the burn-in board, particularly, pins of the device are connected with corresponding pin interfaces of the second interface component respectively; and finally the burn-in board is connected with the burn-in testing apparatus via the first interface component, to carry out the burn-in test on the device.

In particular, on reception of a signal from the device under test via the second interface component, the pin matching unit transmits the signal to the burn-in testing apparatus via the first interface component of the burn-in board by pin matching; and on reception of a signal from the burn-in testing apparatus via the first interface component, the pin matching unit correspondingly transmits the signal to the device via the second interface component by pin matching.

The pin matching process of the pin matching unit is described below with reference to the embodiments and the drawings.

Figure 3:
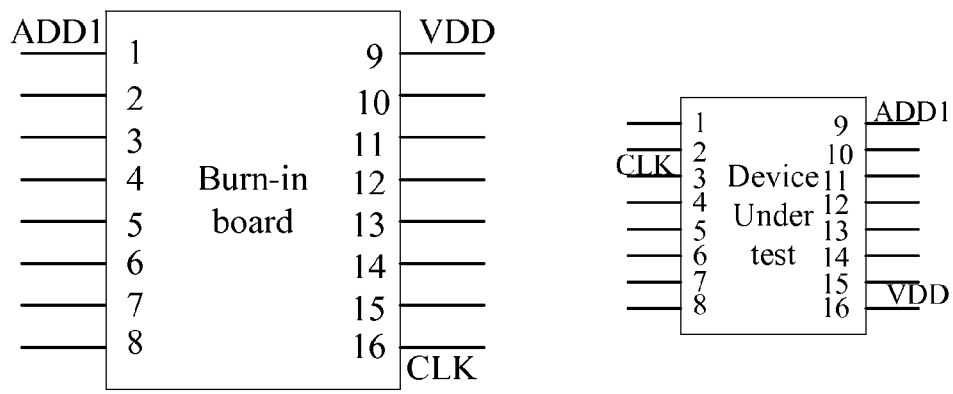
FIG. 3 is a structural diagram of an embodiment of a burn-in testing system according to the invention where the pins are not matched.

As shown in FIG. 3, pin interfaces on the burn-in board corresponding to the pin matching unit include a pin 1, a pin 9 and a pin 16; and signals transmitted via the first interface component of the burn-in board to the pins 1, 9 and 16 correspond to an address signal ADD1, a supply voltage signal VDD and a clock signal CLK, respectively. That is, signals input to and/or output from pins of the pin matching unit corresponding to the pins 1, 9 and 16 shall be the address signal ADD1, the supply voltage signal VDD and the clock signal CLK, respectively. A pin 9, a pin 16 and a pin 3 of the device under test correspond to an address signal ADD1, a supply voltage signal VDD and a clock signal CLK of the device, respectively. Therefore, while mounted on the burn-in board, a difference between the lead description of the first interface component connected with the burn-in testing apparatus and the pin description of the device occurs. If signal transmission of the device under test is performed directly based on the lead description of the first interface component, pins of the device shall receive wrong signals, and the test can not be conducted; in some extreme cases, the device may be damaged.

Figure 4:
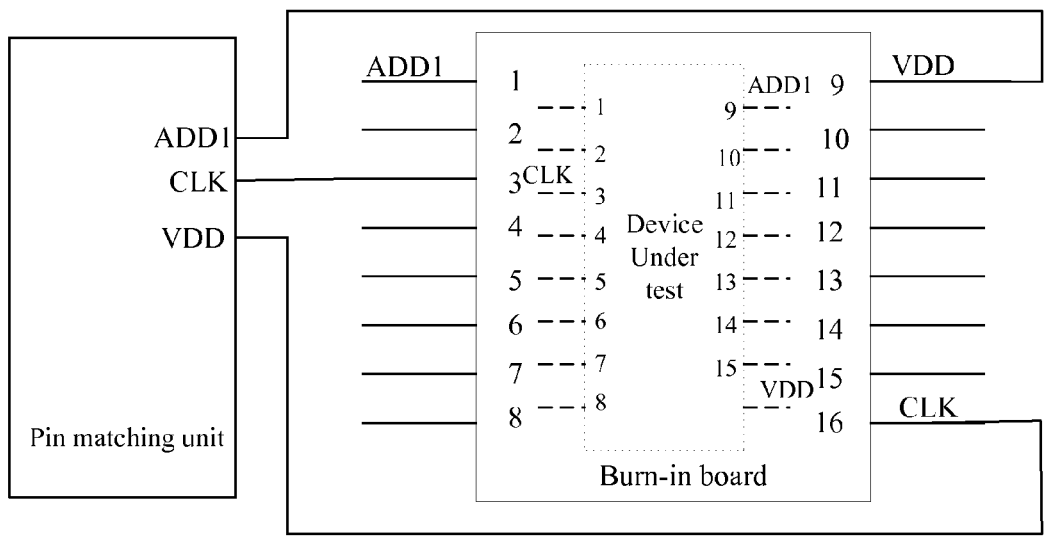
FIG. 4 is a structural diagram of pin matching in an embodiment of a burn-in testing system according to the invention.

Now refer to FIG. 4. The connection relationship between the pins is adjusted using the pin matching unit. That is, a connection relationship between the leads of the first interface component and the pin interfaces of the second interface component is established according to the pin description of the device under test. Therefore, the address signal ADD1, the supply voltage signal VDD and the clock signal CLK received by the first interface component can be transmitted to the pins 9, 16 and 3 of the second interface component respectively, thereby realizing pin matching.

Figure 5:
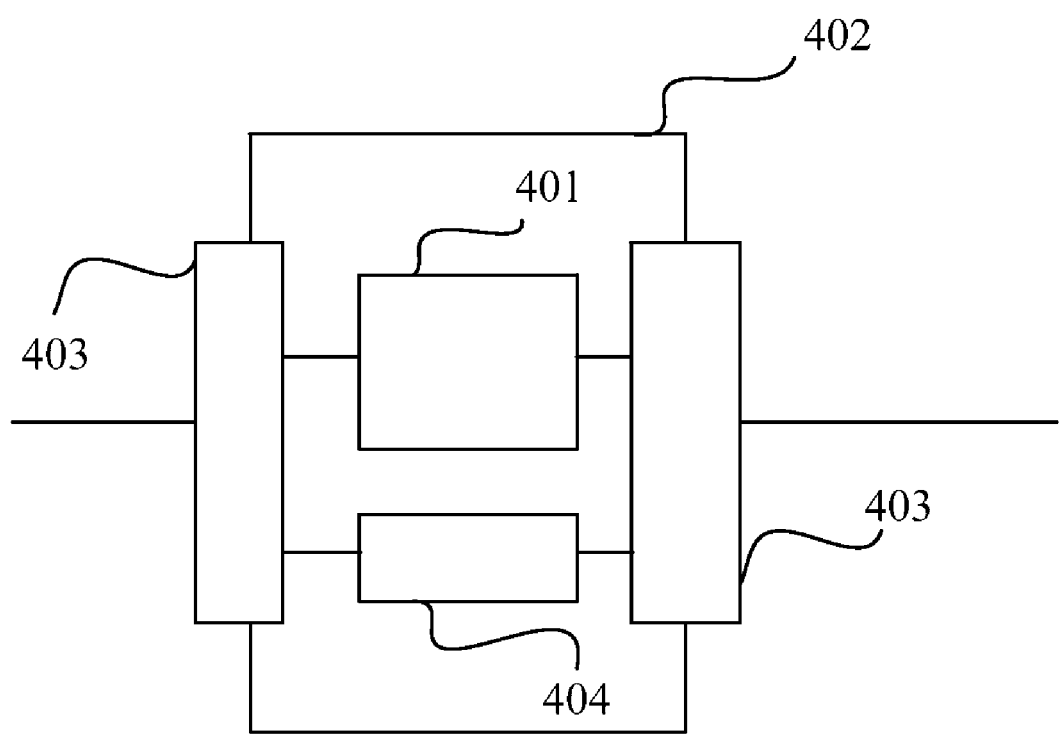
FIG. 5 is a structural diagram of an embodiment of a pin matching unit shown in FIG. 1.

In another embodiment, the pin matching unit is a circuit board including a matching chip, as shown in FIG. 5. The pin matching unit may include: a matching chip 401, adapted to establish signal matching between the second interface component and the first interface component; a package circuit 402 and pins 403, the package circuit 402 being adapted to package the matching chip 401 and to enable signal transmission between the matching chip 401 and external circuits via the pins 403. In addition, the pin matching unit may further include an auxiliary matching unit 404 adapted to perform auxiliary adjustment of a matching result of the matching chip 404. Particularly, the auxiliary matching unit 404 may be formed by a mechanical structure for manually wire jumping, as an additional adjustment for the connection relationship that is not achieved by the programmable IC, or as an assurance manner.

The embodiments of the invention discussed above have the following advantages over the prior art:

Firstly, for burn-in testing of devices having different pin descriptions, the pin matching unit enables dynamic re-matching between the burn-in testing apparatus and pins of the device under test for transmitted signals according to the pin description of the device, without being limited by the inherent pin description of the second interface component of the burn-in board for connecting with the device under test.

Secondly, the pin matching unit is flexibly and detachably connected with the burn-in board, so that burn-tests of various devices having the same number of pins and different pin descriptions can be performed using the same burn-in board, and it is no longer needed to make a corresponding burn-in board for each new type of devices, thereby improving utilization of the existing burn-in board.

Next, compared with the burn-in board, the pin matching unit has a lower production cost and a shorter cycle time, thereby improving production efficiency and reducing production costs.

The invention is described above in connection with preferred embodiments. However, the preferred embodiments shall not limit the scope of the invention. Those skilled in the art can make various alternations and modifications to the preferred embodiments without departing from the spirit and scope of the invention. Therefore, the scope of the invention shall be defined as in the appended claims.

The invention claimed is:

1. A burn-in testing system, comprising a burn-in board and a burn-in testing apparatus, the burn-in board comprising:
   a first interface component, adapted to connect with the burn-in testing apparatus for signal input and/or output between the burn-in board and the burn-in testing apparatus; and
   a second interface component, adapted to connect with a device under test for signal input and/or output between the burn-in board and the device under test,
   wherein the burn-in testing system further comprises a pin matching unit, which is flexibly connected with the burn-in board and is adapted to adjust signal connection relationship between the first interface component and the second interface component according to a pin description of the device, and
   wherein the pin matching unit comprises:
      a matching chip, adapted to establish signal matching between the second interface component and the first interface component; and
      a package circuit and pins, the package circuit adapted to package the matching chip and to enable signal transmission between the matching chip and external circuits via the pins.

2. The burn-in testing system according to claim 1, wherein the burn-in board further comprises a plurality of pin interfaces corresponding to the pin matching unit.

3. The burn-in testing system according to claim 2, wherein the pin interfaces comprises a first interface section connected with the first interface component, and a second interface section connected with the second interface component.

4. The burn-in testing system according to claim 2, wherein the pin matching unit comprises a plurality of pins, which are plugged in the pin interfaces for connecting the first interface section and the second interface section of the pin interfaces.

5. The burn-in testing system according to claim 2, wherein the pin matching unit is mounted on an opposite side of the burn-in board with respect to the second interface component.

6. The burn-in testing system according to claim 1, wherein the pin matching unit further comprises an auxiliary matching unit adapted to perform auxiliary adjustment of a matching result of the matching chip.

7. The burn-in testing system according to claim 1, wherein the second interface component is fixedly connected with the burn-in board.

* * * * *